United States Patent
Khoshnood et al.

(10) Patent No.: US 10,045,636 B2
(45) Date of Patent: Aug. 14, 2018

(54) INTELLIGENT INVENTORY STORAGE SYSTEM

(71) Applicant: Inovaxe Corporation, Deerfield Beach, FL (US)

(72) Inventors: Bahman Khoshnood, Boca Raton, FL (US); David Charles Ocasio, Orange Park, FL (US); Venkat Rao Yeeli, Hyderabad (IN); Michael David Adamson, Boynton Beach, FL (US)

(73) Assignee: INOVAXE CORPORATION, Deerfield Beach, FL (US)

( * ) Notice: Subject to any disclaimer, the term of this patent is extended or adjusted under 35 U.S.C. 154(b) by 0 days.

(21) Appl. No.: 15/553,824

(22) PCT Filed: Feb. 29, 2016

(86) PCT No.: PCT/US2016/020086
§ 371 (c)(1),
(2) Date: Aug. 25, 2017

(87) PCT Pub. No.: WO2016/138523
PCT Pub. Date: Sep. 1, 2016

(65) Prior Publication Data
US 2018/0020845 A1 Jan. 25, 2018

Related U.S. Application Data

(60) Provisional application No. 62/121,896, filed on Feb. 27, 2015.

(51) Int. Cl.
*A47F 1/12* (2006.01)
*A47F 10/04* (2006.01)
*A47F 5/10* (2006.01)
*A47F 7/00* (2006.01)
*G06Q 10/08* (2012.01)
*G06Q 50/28* (2012.01)
*H05K 13/02* (2006.01)
*A47F 7/14* (2006.01)
*A47F 10/00* (2006.01)

(52) U.S. Cl.
CPC .............. *A47F 1/12* (2013.01); *A47F 5/108* (2013.01); *A47F 7/005* (2013.01); *A47F 7/144* (2013.01); *A47F 10/04* (2013.01); *G06Q 10/087* (2013.01); *G06Q 50/28* (2013.01); *H05K 13/021* (2013.01); *A47F 2010/005* (2013.01)

(58) Field of Classification Search
CPC .. A47F 1/12; A47F 5/108; A47F 7/005; A47F 7/144; A47F 10/04; A47F 2010/005; G06Q 10/087; G06Q 50/28; H05K 13/021; H05K 13/0434; H05K 13/08; H05K 13/0084; B65G 1/137; B65G 1/1371
See application file for complete search history.

(56) References Cited

U.S. PATENT DOCUMENTS 3,338,421 A 8/1967 Lyman
2003/0156427 A1 8/2003 Robey
2003/0156428 A1 8/2003 Robey

*Primary Examiner* — Patrick D Hawn
(74) *Attorney, Agent, or Firm* — Robert M. Downey, P.A.

(57) ABSTRACT

An apparatus for storing and retrieving electronic components such as, but not limited to: capacitors; resistors; and integrated circuits. Components are stored based on single package single location in lockable racks in a transportable cart. Information for each stored component, such as its part number, location, and quantity is stored in the local electronic board and is shared via Wi-Fi to a network of PCs.

9 Claims, 20 Drawing Sheets

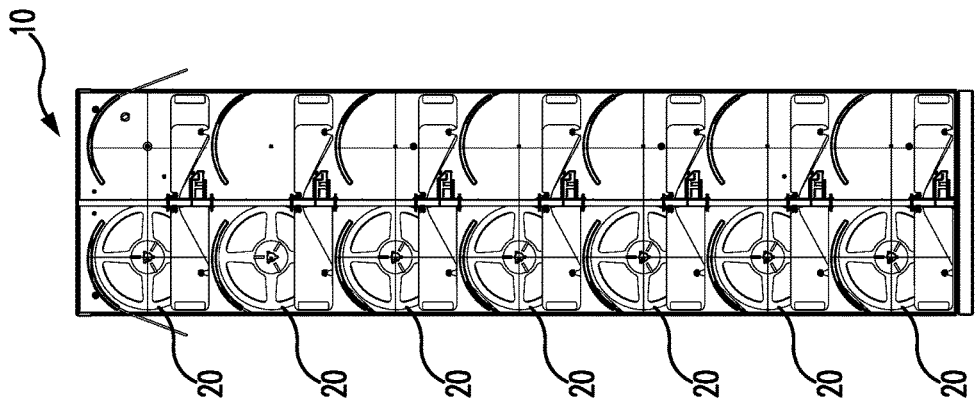
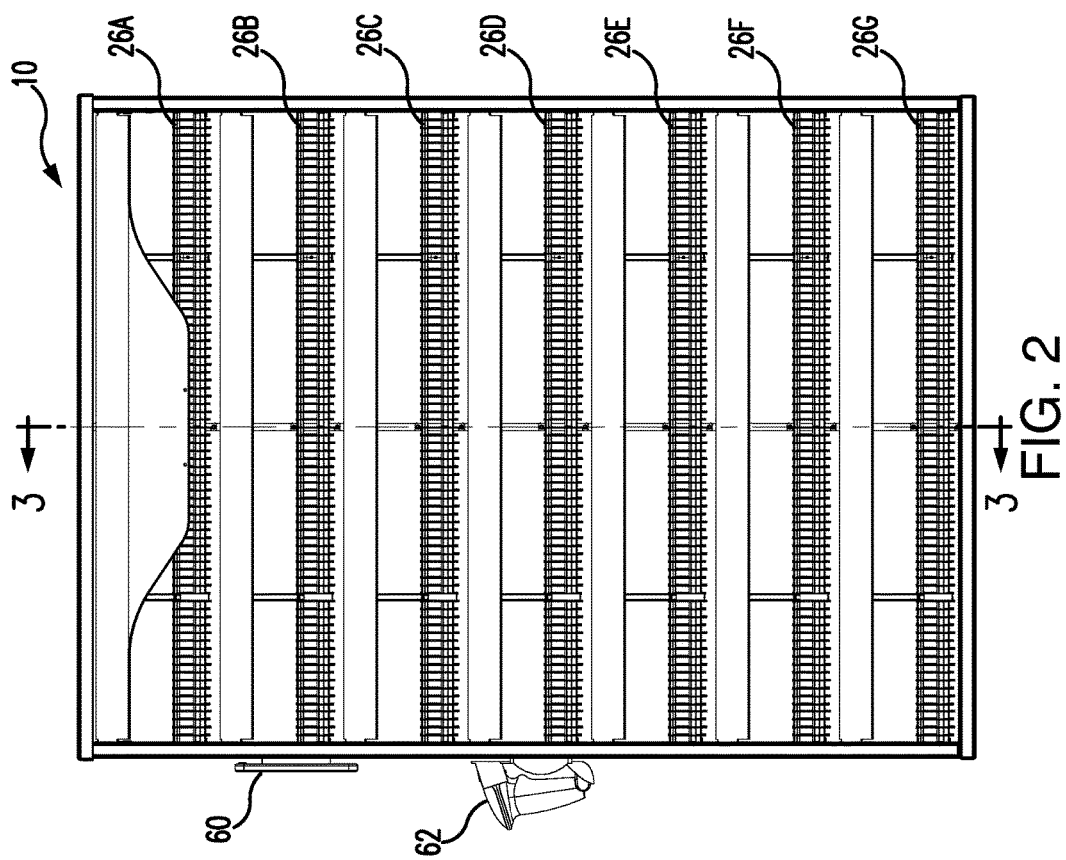

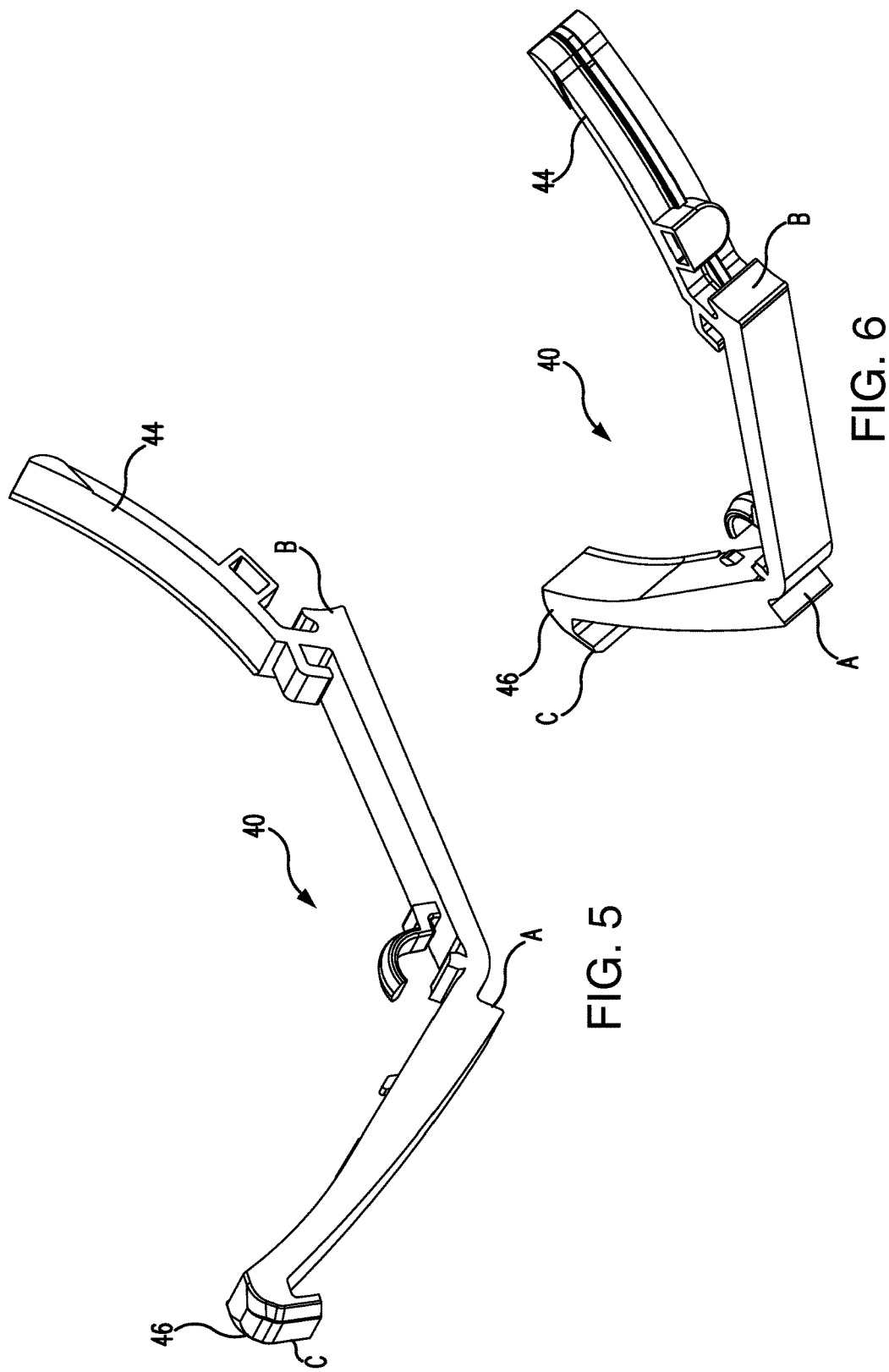

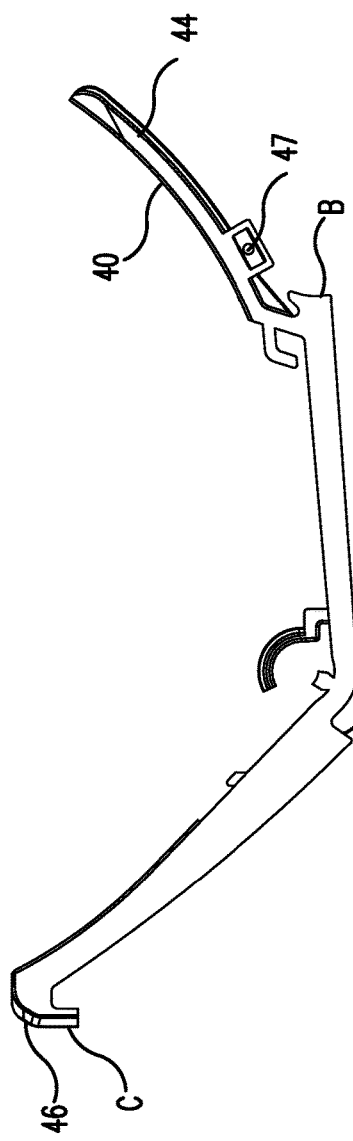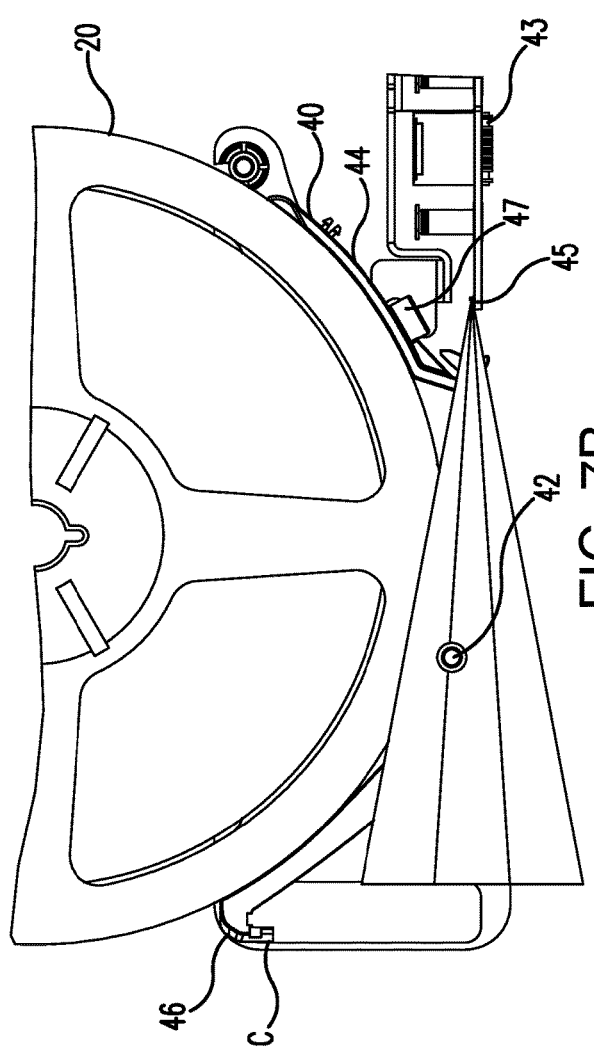

INTELLIGENT INVENTORY STORAGE SYSTEM

BACKGROUND OF THE INVENTION

This non-provisional patent application is based on Patent Cooperation Treaty (PCT) patent application serial no. PCT/US2016/020086 filed Feb. 29, 2016, which is based on provisional patent application Ser. No. 62/121,896 filed Feb. 27, 2015.

DISCUSSION OF THE RELATED ART

Electronic manufacturers and distributors typically have thousands of parts and packages that they need to store. A typical kit consists of many (over 50) different part numbers and as many packages. Storing and retrieving parts and packages from inventory is often challenging and labor intensive. Also, the accuracy of the inventory is critical to the efficiency of a company's operation. The device disclosed herein reduces the amount of labor and space that is required to store and retrieve the components needed in a company's operation and will enable the operation to substantially increase the inventory accuracy of the parts on hand.

SUMMARY OF THE INVENTION

An intelligent inventory storage system stores more than 1,100 7" SMT reels. It is equipped with sensors and LED indicator lights, along with Locator software, and responds as if the reels have RFID on them. The operator simply scans a barcode on a reel and inserts the reel into an empty Single Package Single Location slot within a cart. The system then reports the position of the part to its controller automatically and then to a server via a Wi-Fi connection.

In order to retrieve parts, the user quickly enters a part number or a pick list of multiple parts into the computer and an LED will light up indicating each part's location within the cart. As the user picks the parts, the system identifies the part numbers that were removed on a tablet or screen. The cart is mobile, ESD compliant, 5½ feet tall, with less than a 5½ square footprint, which is a fraction of the size of robotic towers commonly used in the industry, and yet has five times the throughput capacity.

OBJECTS AND ADVANTAGES OF THE INVENTION

It is an object of the invention to provide an intelligent inventory storage system for storing electronic components on SMT reels within an arrangement of slots on a cart, and wherein a light pipe is used at each slot to indicate the status of each slot using dual color LEDs.

It is a further object of the present invention to provide an intelligent inventory storage system including a cart having a plurality of rows with dividers in each row to form storage slots, and wherein each slot is provided with a light pipe that includes a cradle structure for holding an SMT reel, and wherein the light pipe is pivotable about a pivot axis to allow movement of the light pipe and cradle structure between a stowed position and a release position for loading an SMT reel into a slot of the divider and for removing an SMT reel from a slot of the divider.

It is still a further object of the present invention to provide an intelligent inventory storage system, wherein the light pipe has two points of entry for light, one when the reel is in the stowed position and another light entry point when the light pipe is moved to the release position indicating that an SMT reel has been removed from a slot in the divider.

It is still a further object of the present invention to provide an intelligent inventory storage system, as described above, wherein the cart includes a plurality of doors that are movable to lock in the SMT reels and prevent the SMT reels from being removed from the cart, while still allowing the light pipe to function in order to indicate the status of the SMT reels.

It is still a further object of the present invention to provide an intelligent inventory storage system, as described above, wherein the cart includes an electronic/mechanical lock for locking the doors in a closed position.

It is still a further object of the present invention to provide an intelligent inventory storage system, as described above, wherein the cart allows for dispensing of components/parts from tapes on each of the SMT reels stored therein, even when the doors are in the closed and locked position.

It is yet a further object of the present invention to provide an intelligent inventory storage system, as described above, wherein the cart is linked to a computer and/or tablet controller, allowing the computer or tablet to communicate with the cart for purposes of selecting parts/components to be retrieved from the cart and for tracking inventory of parts/components on the cart.

It is still a further object of the present invention to provide an intelligent inventory storage system, as described above, which calculates the approximate amount of parts/components left on an SMT reel based on the diameter of tape remaining on the reel, pitch of the components on the tape, thickness of the tape and the anticipated usage when it was issued.

These and other objects and advantages of the present invention are more readily apparent with reference to the detailed description and accompanying drawings.

BRIEF DESCRIPTION OF THE DRAWINGS

For a fuller understanding of the nature of the present invention, reference should be made to the accompanying drawings taken in conjunction with the following detailed description wherein:

FIG. 2 is a side elevational view of the cart of FIG. 1 showing the rows of divider assemblies for providing the single package single location storage slots to hold the SMT reels;

FIG. 3 is a cross sectional view taken along the line indicated by the arrows 3-3 in FIG. 2, and showing the SMT reels stored in the rows on one side of the cart;

FIG. 5 is a front perspective view of a light pipe of the present invention for holding an individual SMT reel and to assist with removal and replacement of the reel within a storage slot of the divider assembly in one of the rows of the cart, and wherein the light pipe is structured to allow entry of light through two separate entry locations depending upon the pivoted position of the light pipe within the divider assembly in the cart;

FIG. 6 is a bottom, rear perspective view of the light pipe of FIG. 5;

FIG. 7A is a side elevational view of the light pipe;

FIG. 7B is an isolated side elevational view showing an SMT reel seated within the cradle of the light pipe, and wherein the light pipe is pivotal about a metal rod between two positions, wherein a first position directs light from an LED through a first light entry location and a second position (as shown) directs light from the LED through a second light entry point;

DETAILED DESCRIPTION OF THE PREFERRED EMBODIMENT

Figure 1:
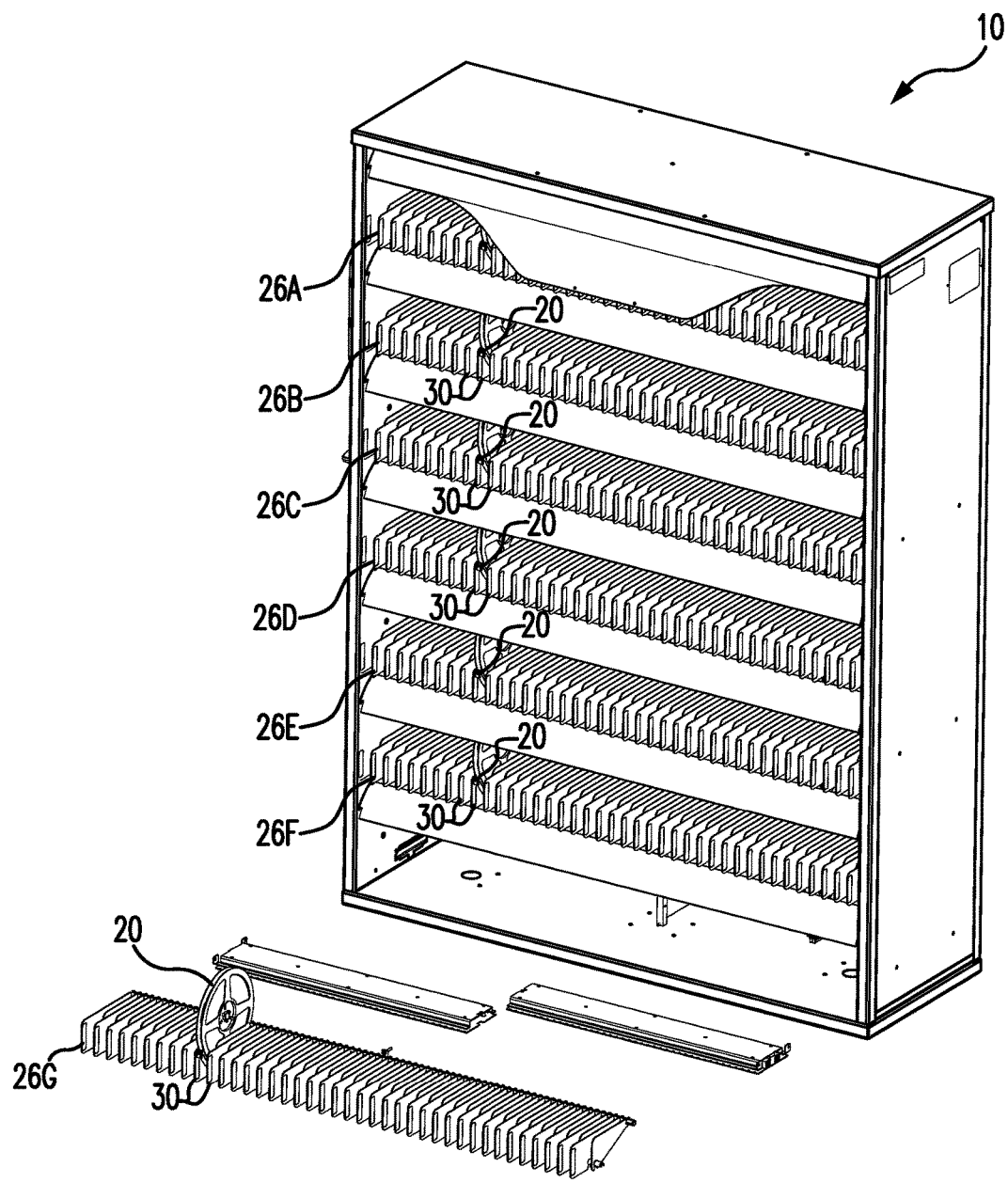
FIG. 1 is a side perspective view of a storage cart according to a preferred embodiment of the Intelligent Inventory Storage System of the present invention, wherein the cart includes 14 rows (7 on each side) for storing SMT reels in single package single locations using plastic divider assemblies, and wherein 1 row of plastic dividers is removed for illustration purposes.
Figure 4:
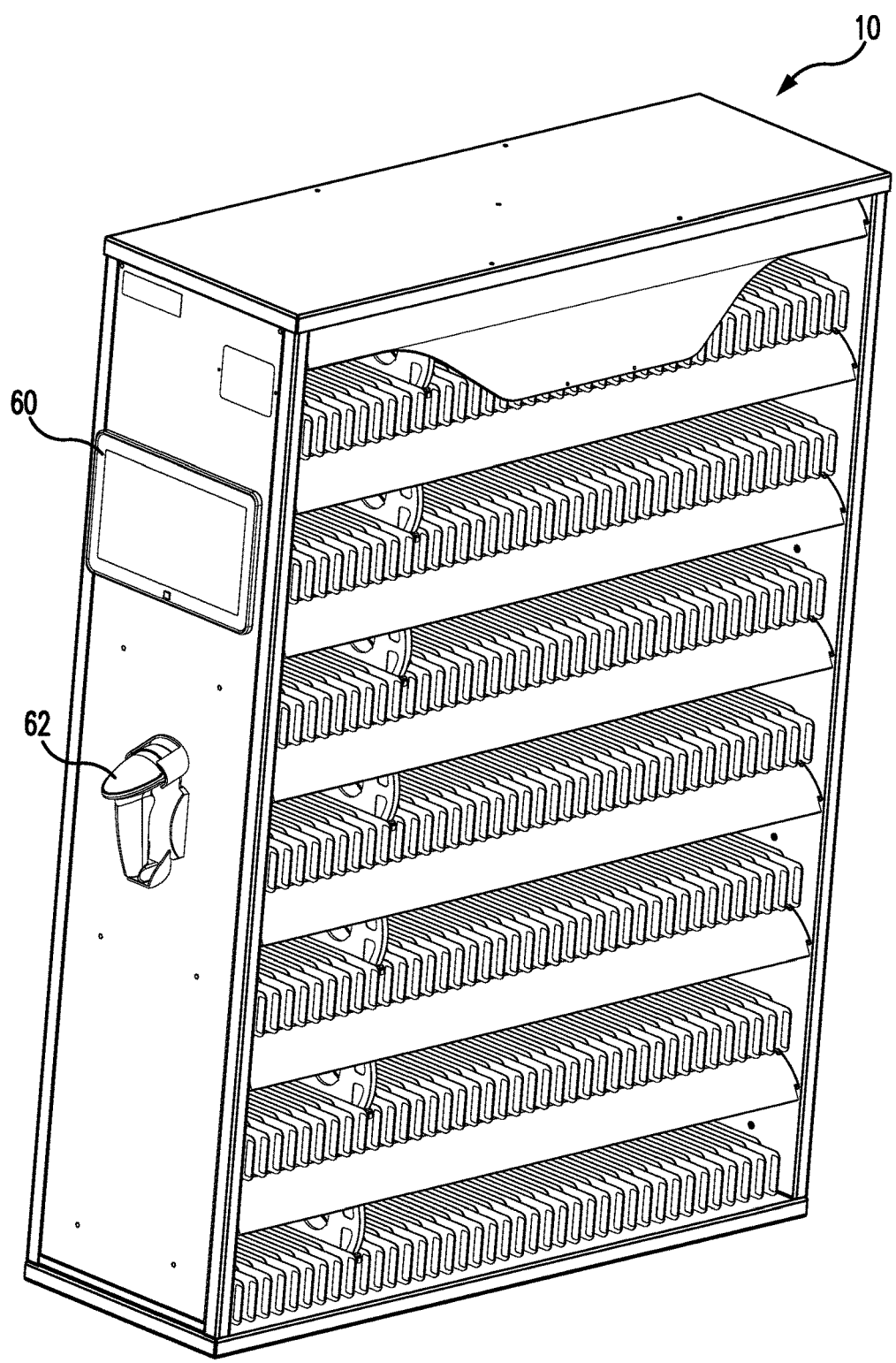
FIG. 4 is a perspective view showing one side and an end of the cart having an electronic tablet and removable barcode scanner device mounted thereto.
Figure 8:
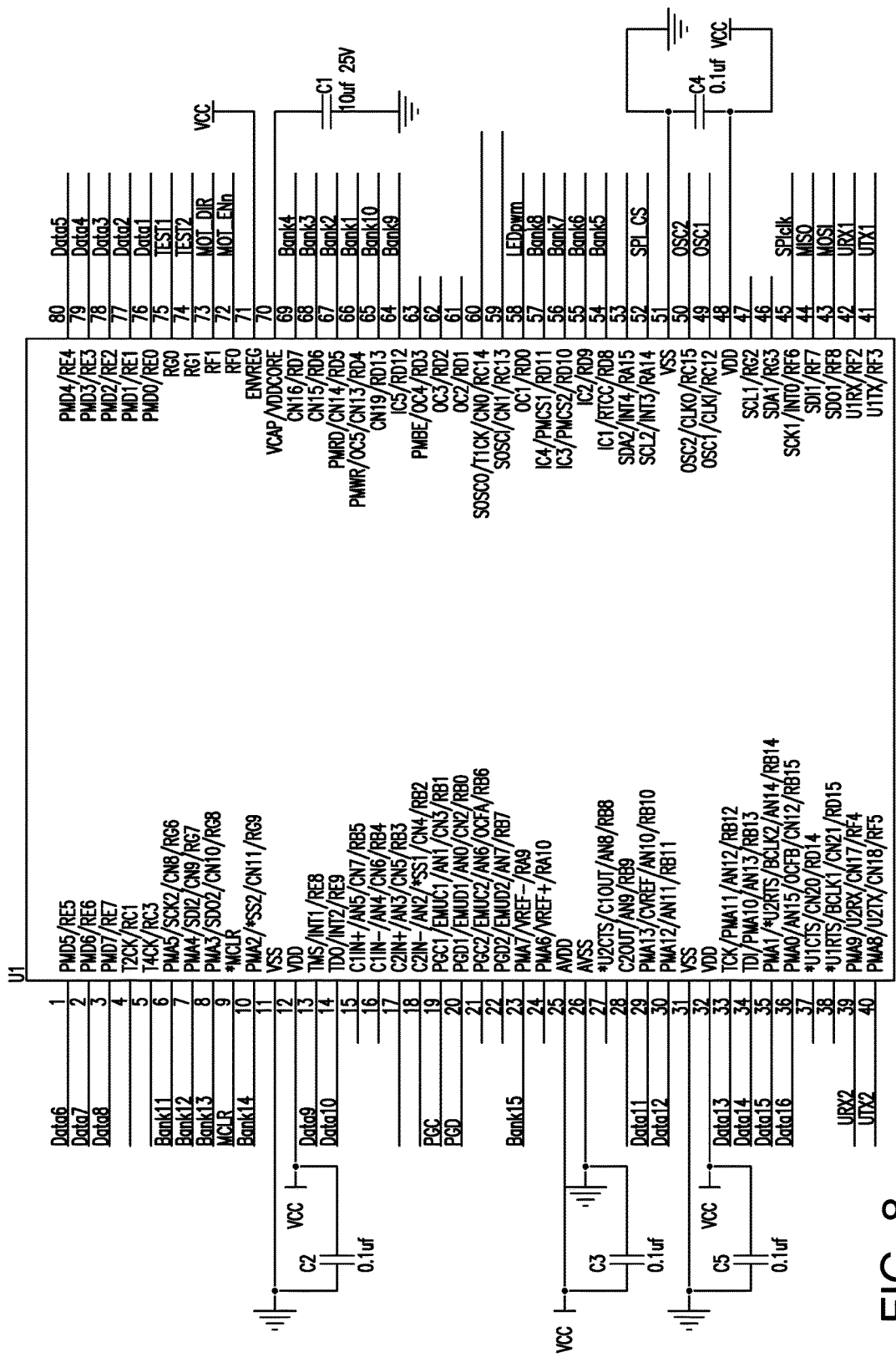
FIG. 8 is a schematic diagram of the microcontroller circuitry of the PCB assembly for holding the firmware and for communicating with the main PC/tablet and for controlling illumination of any of the 80 dual-color LEDs between on and off states and for reading the status of all switches.
Figure 8:
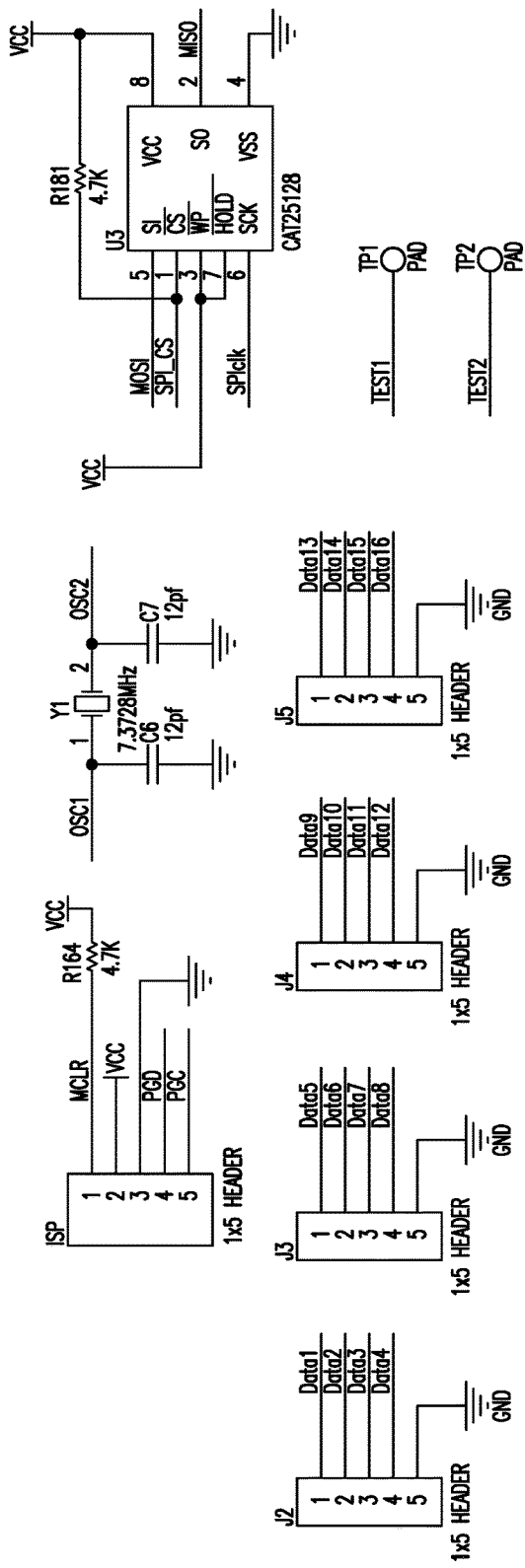
Figure 9:
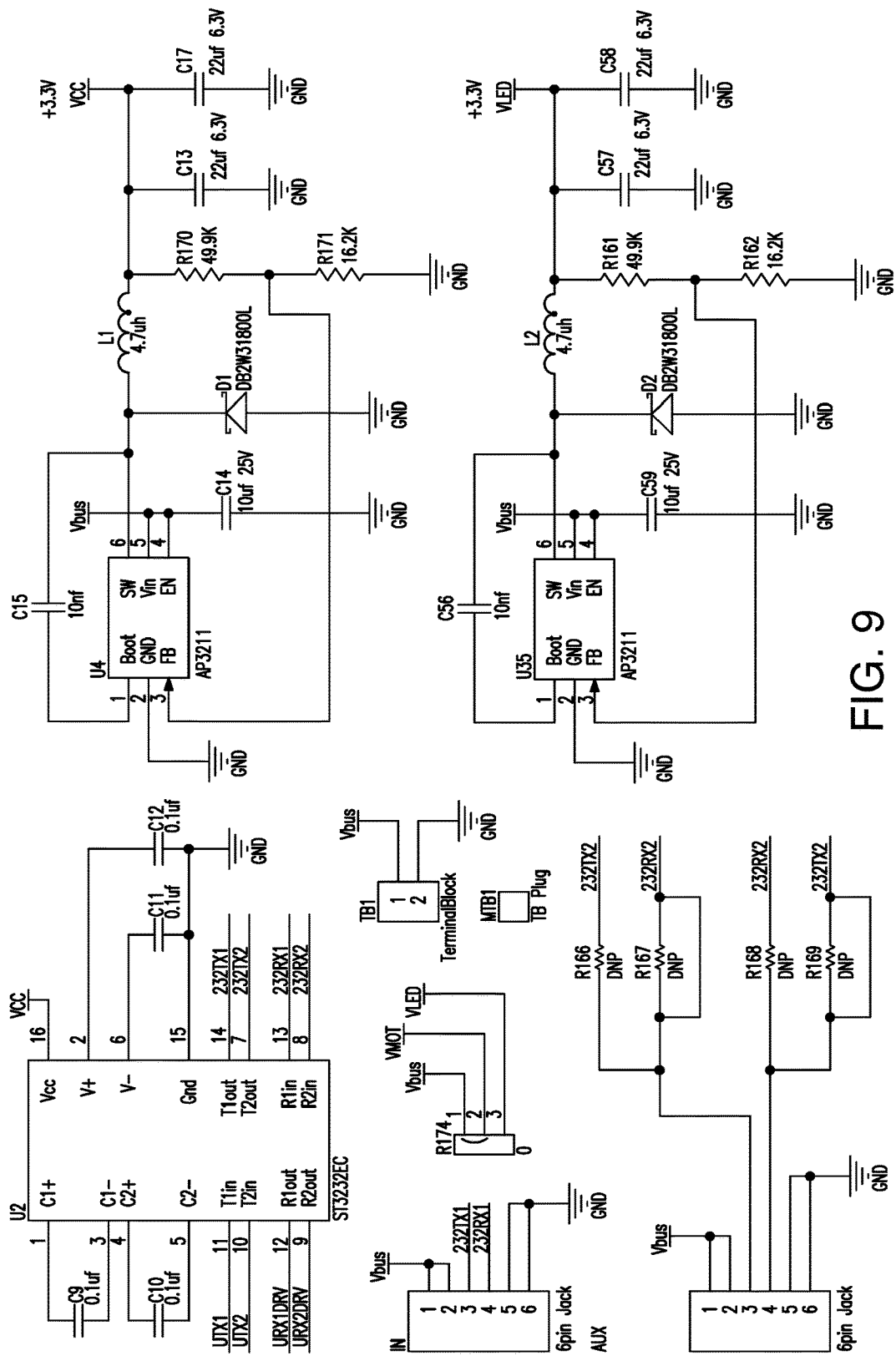
FIG. 9 is a schematic diagram showing the RS 232 driver, U2, and the power supplies, U4 and U35, as well as the electronic lock controls.
Figure 9:
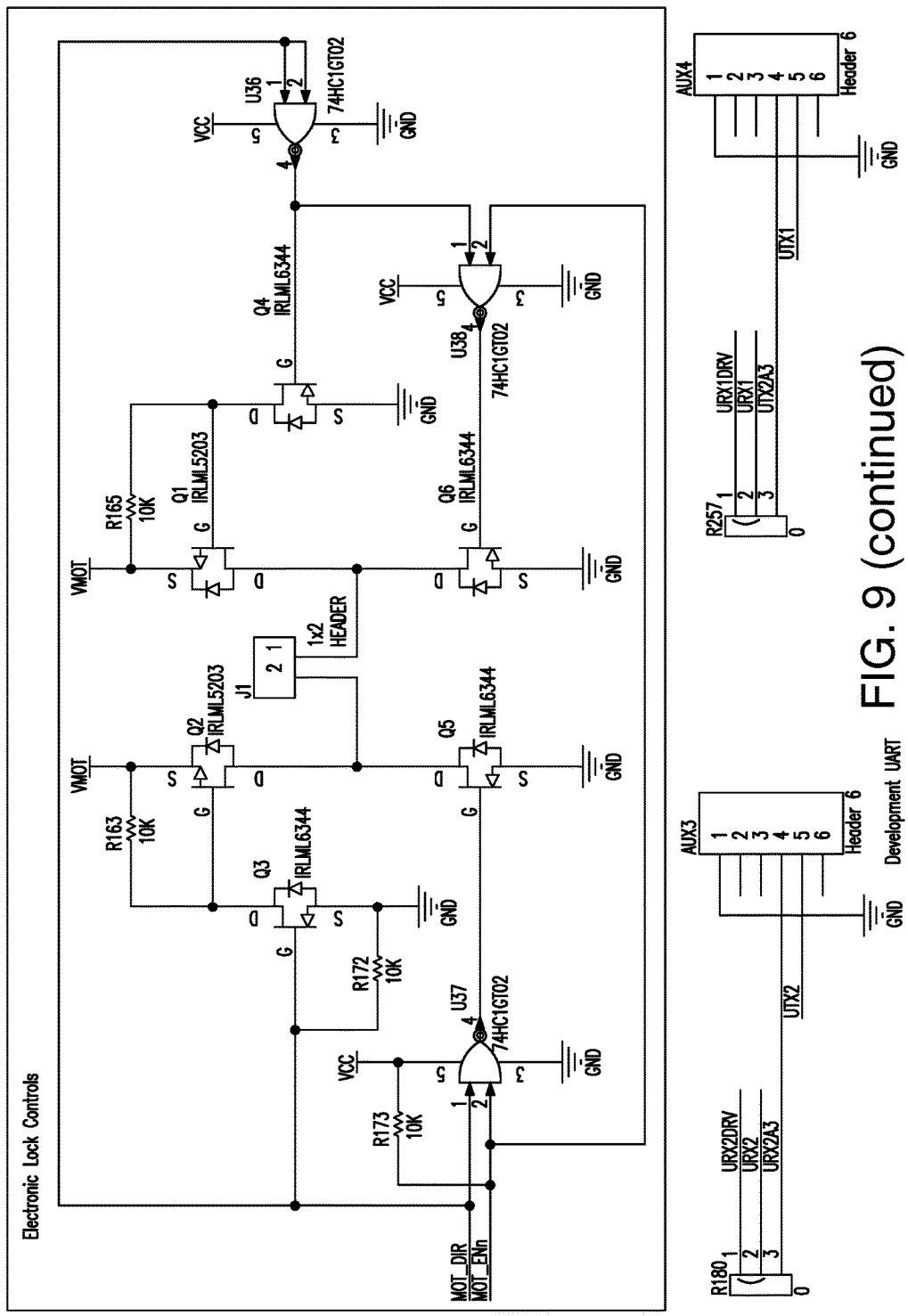
Figure 10:
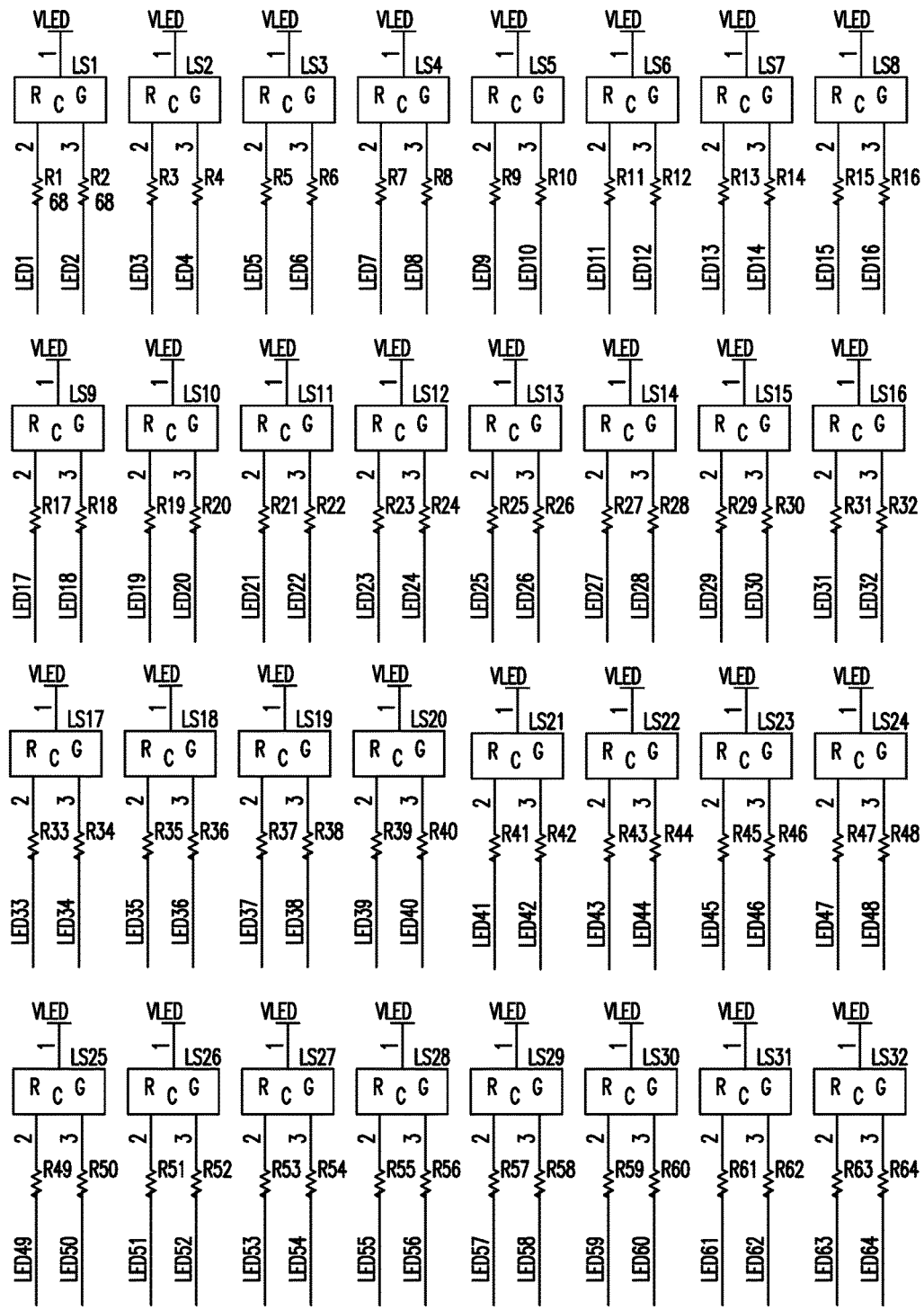
FIG. 10 is a schematic diagram showing the LEDs (LED1-LED80) with their associated resistor to limit the brightness of the LEDs.
Figure 10:
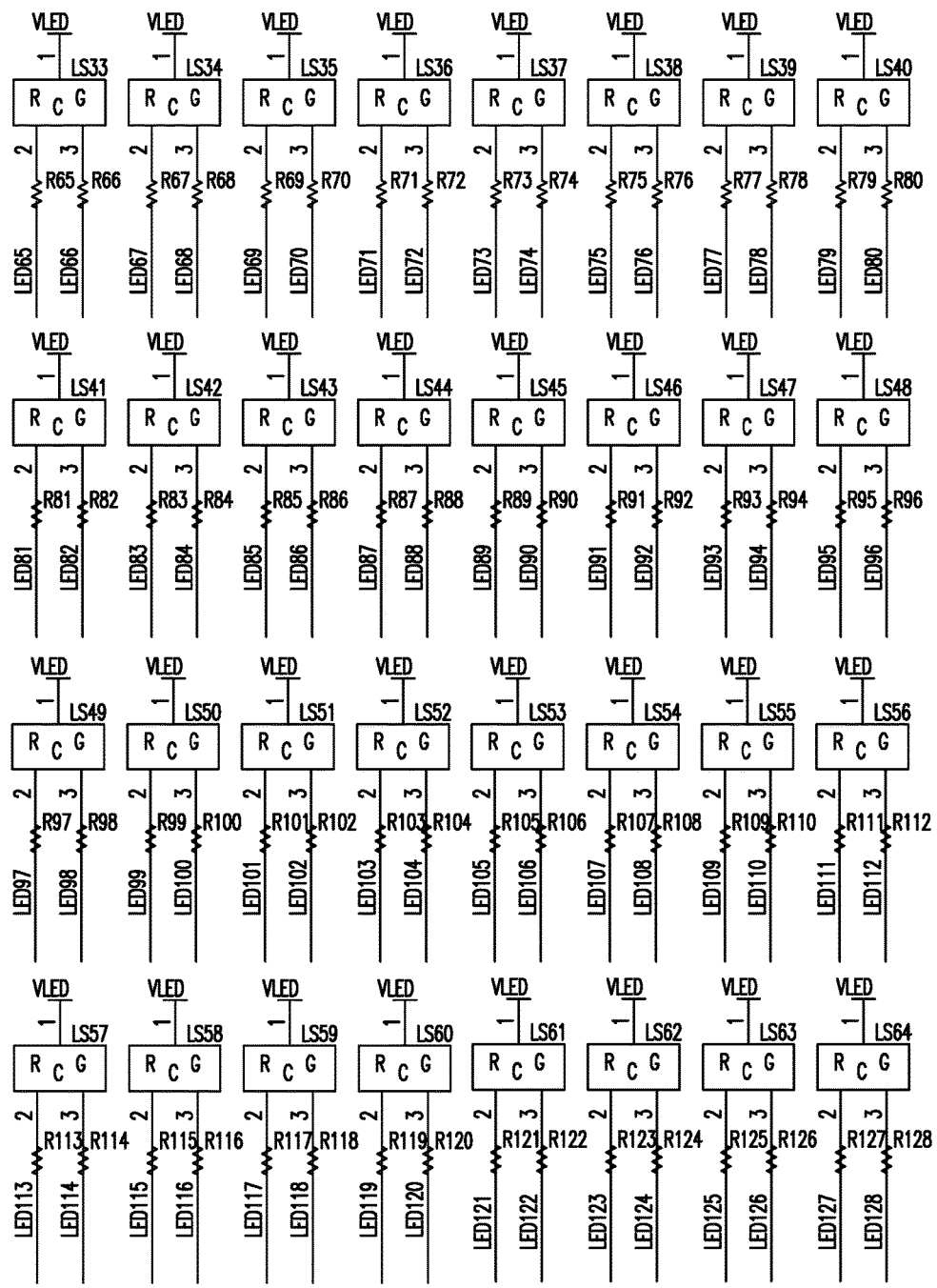
Figure 10:
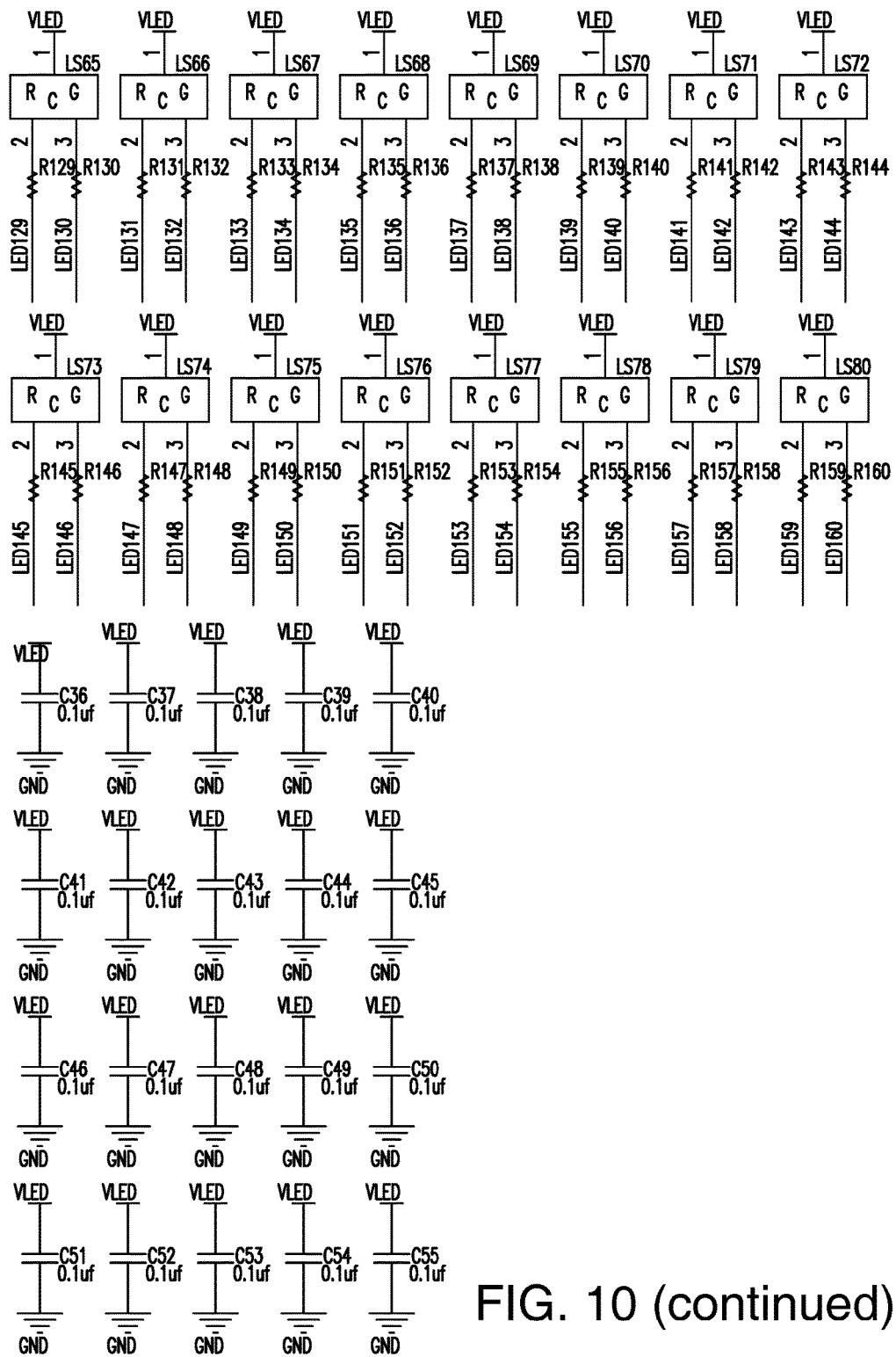
Figure 11:
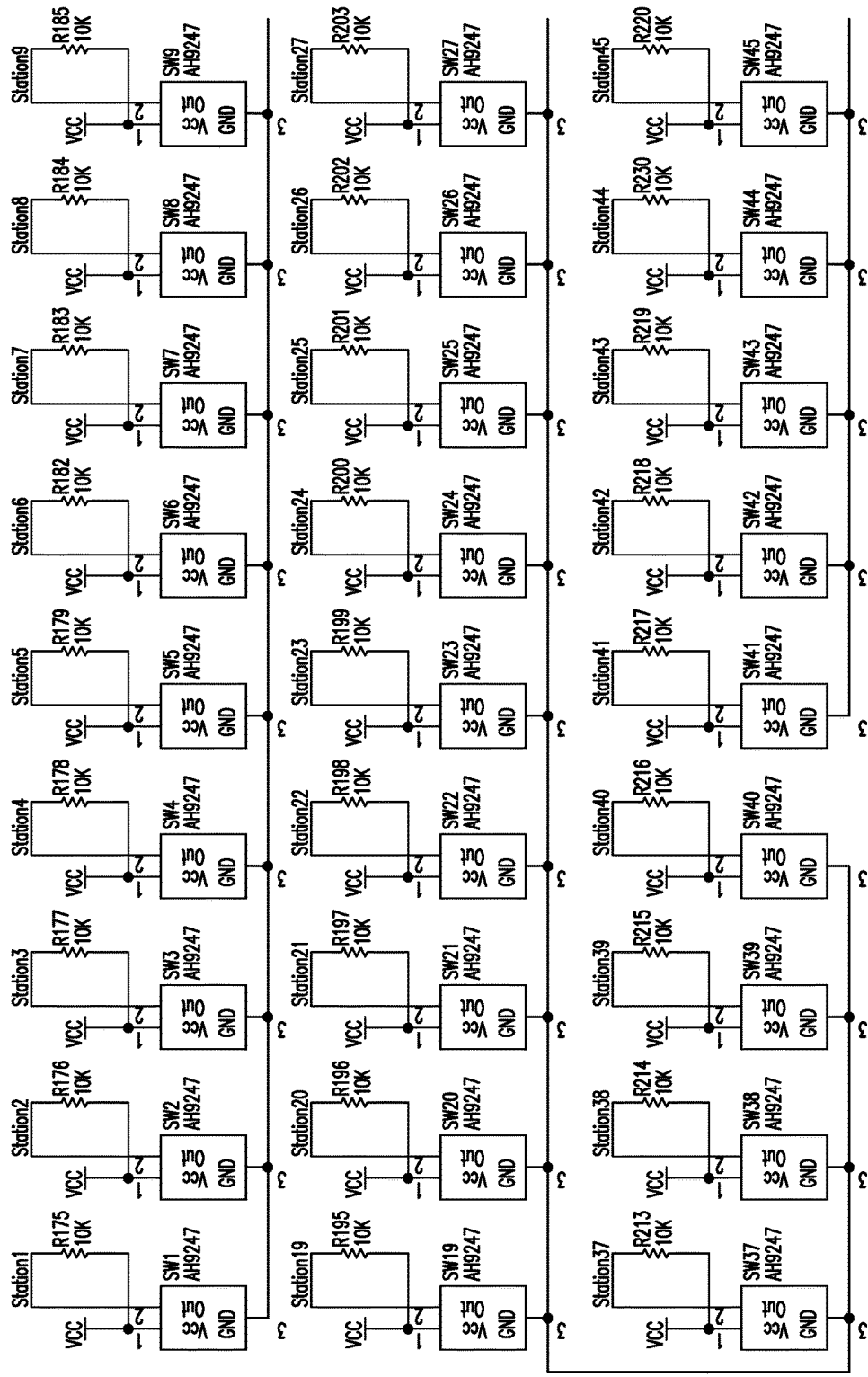
FIG. 11 is a schematic diagram showing the switches/hall effect sensors in the PCB (SW1-SW80)
Figure 11:
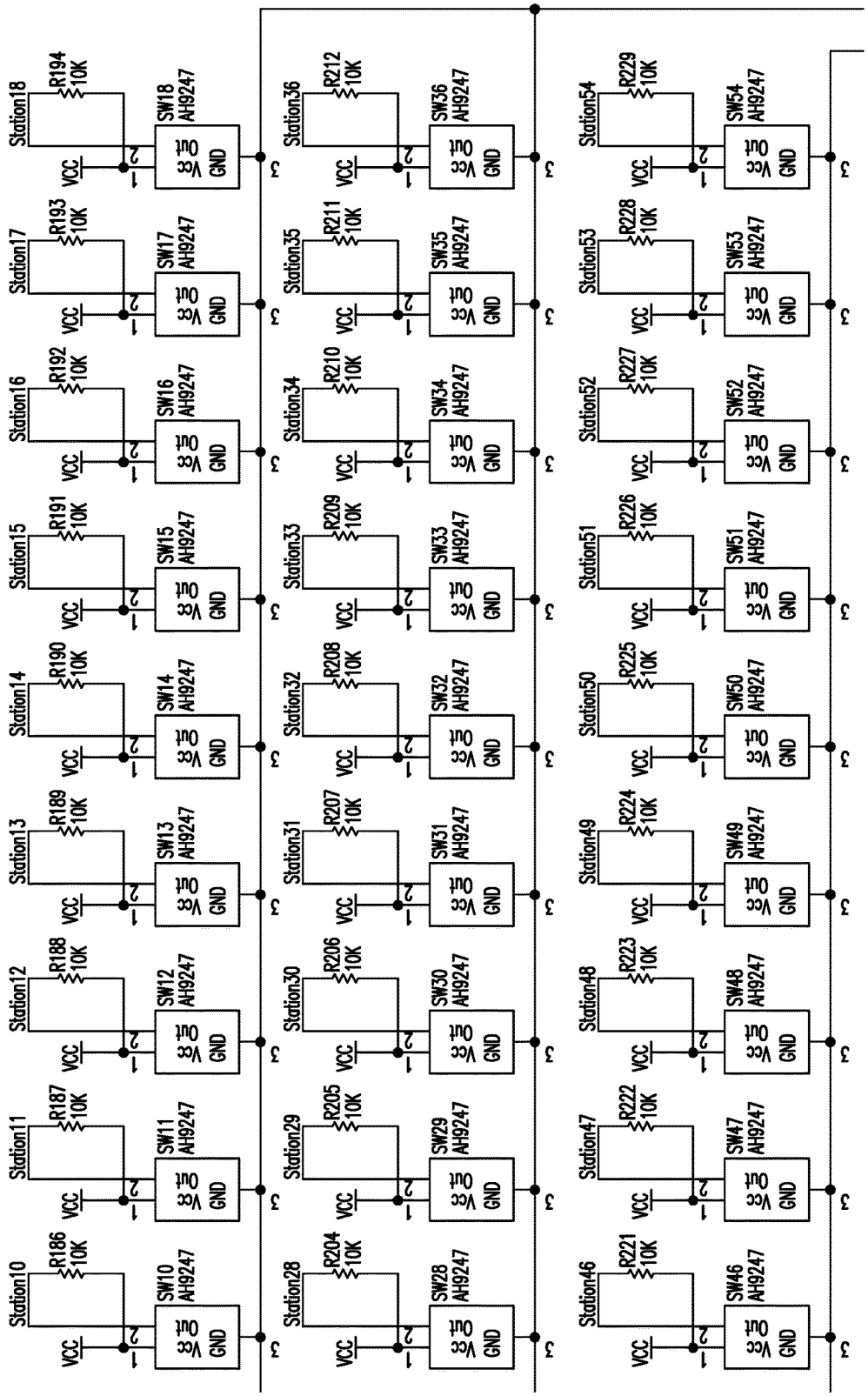
Figure 11:
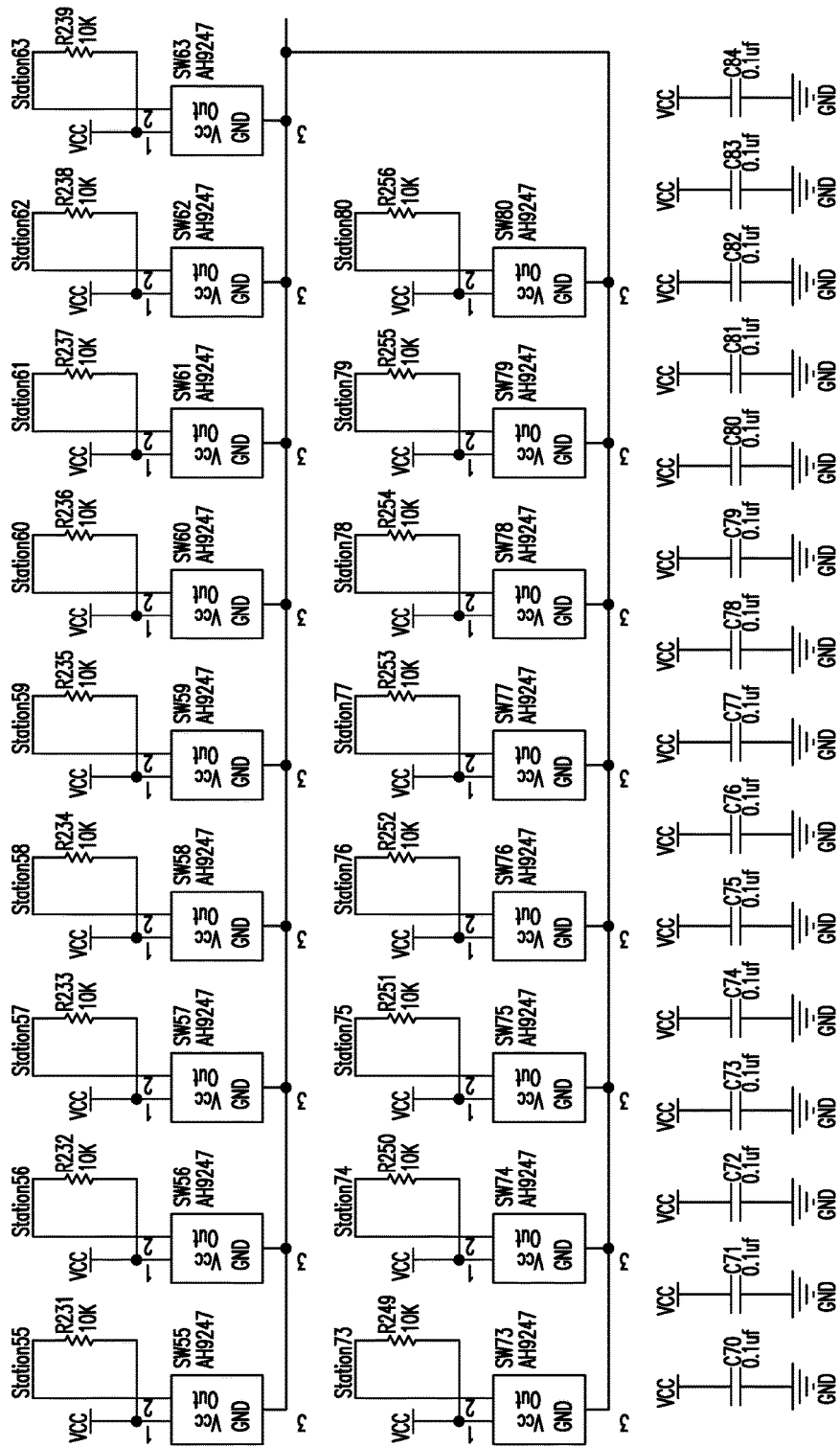
Figure 11:
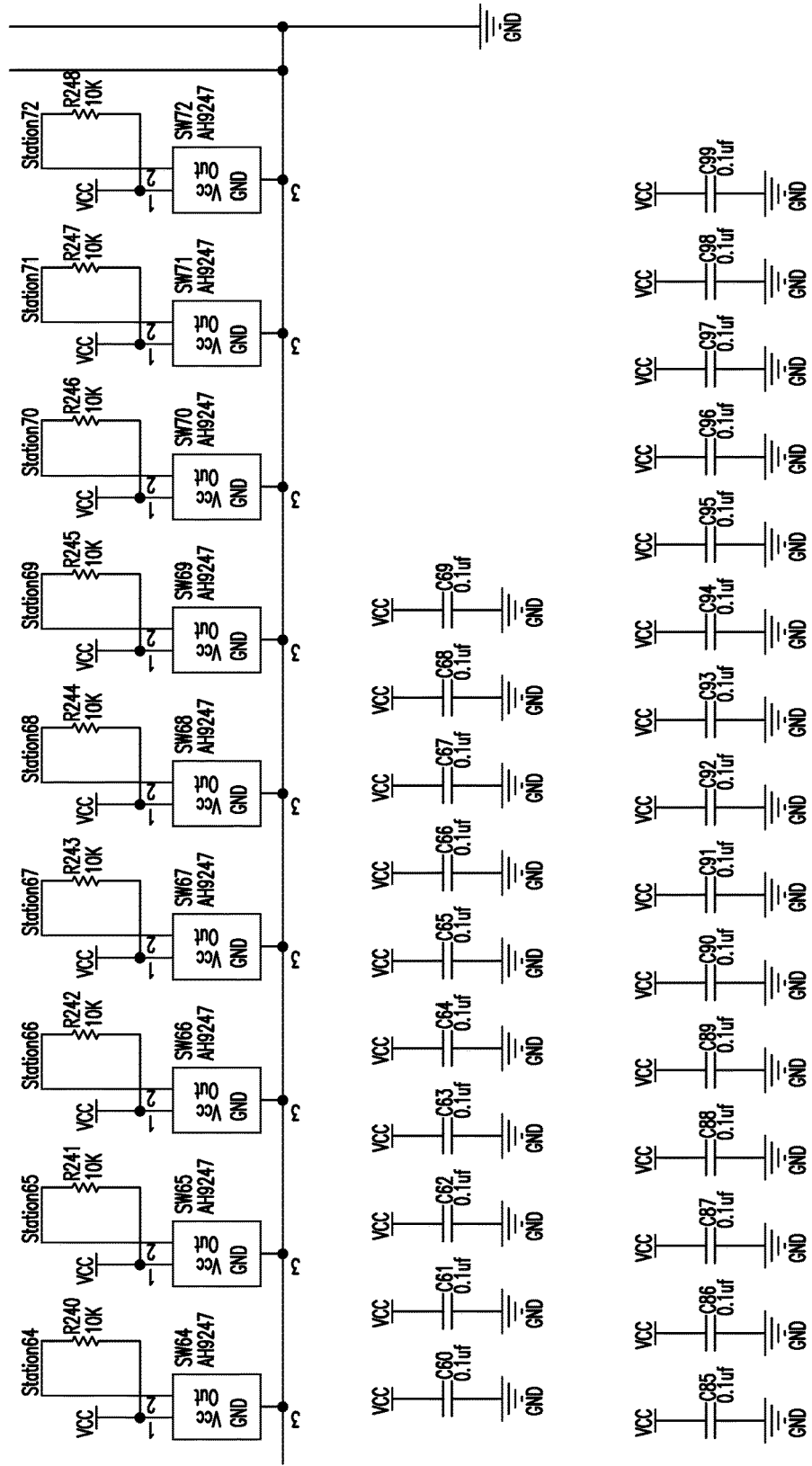
Figure 12:
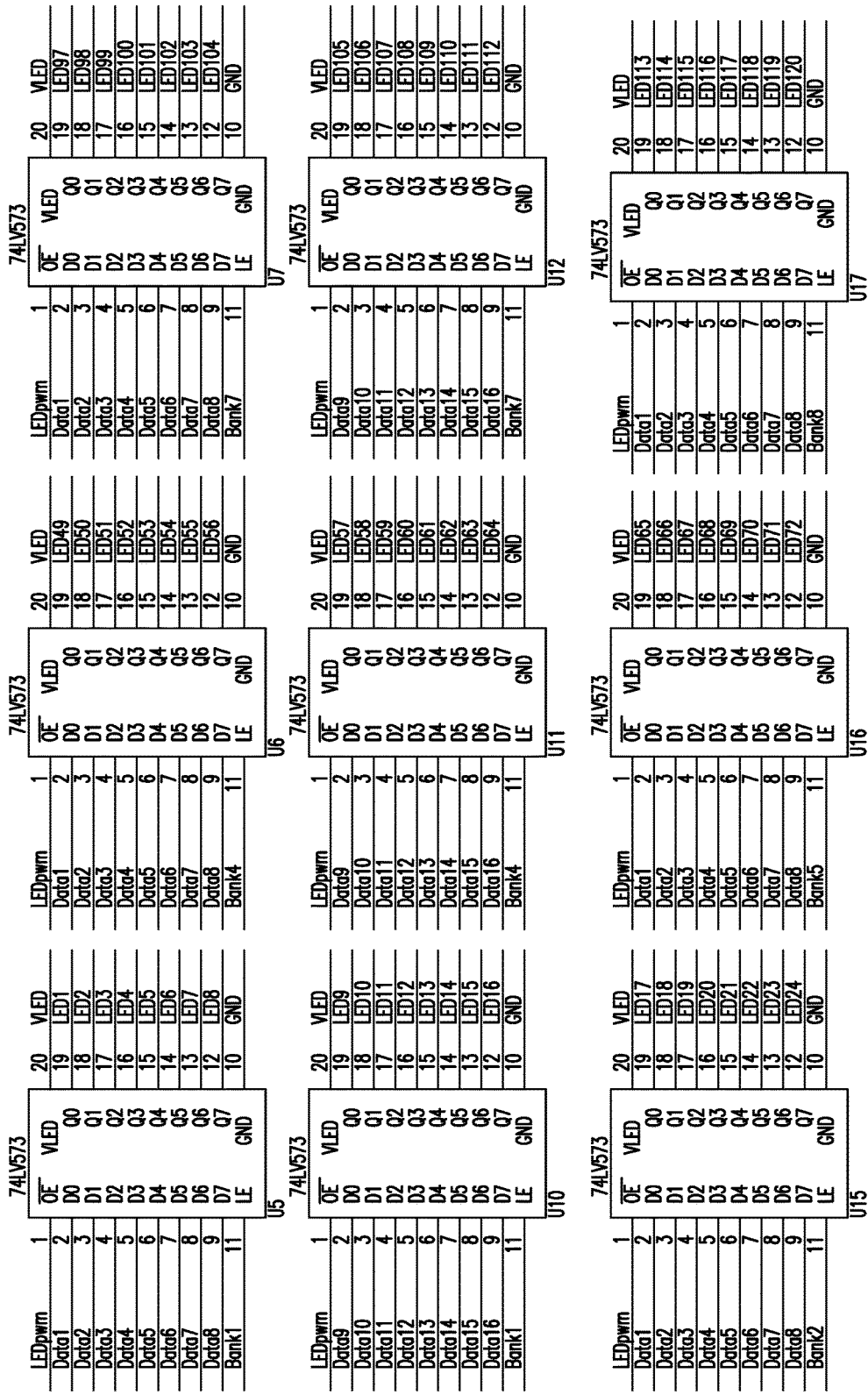
FIG. 12 is a schematic diagram showing the latch ICs used for reading the hall effect sensor outputs, and for driving the LEDs.
Figure 12:
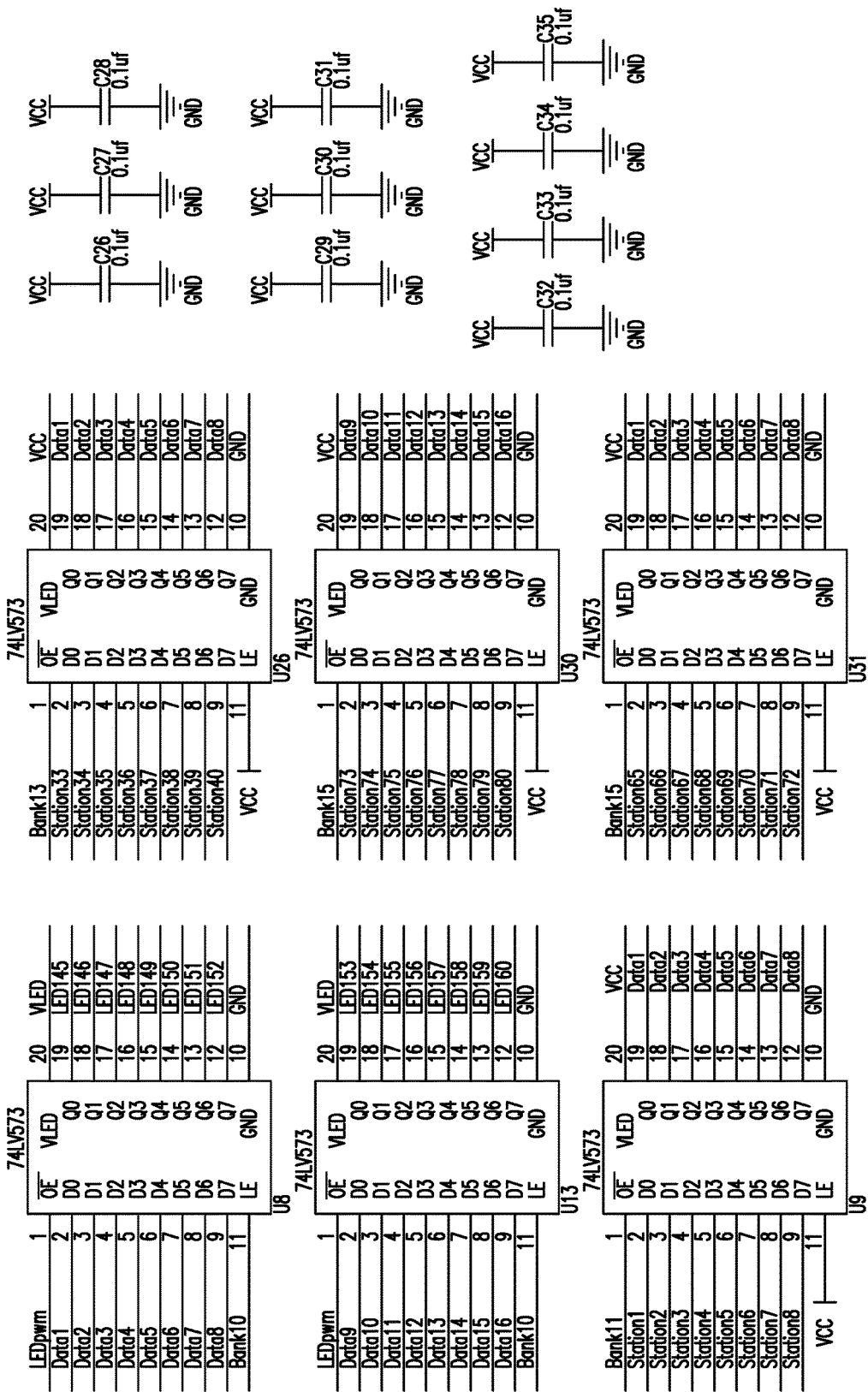
Figure 12:
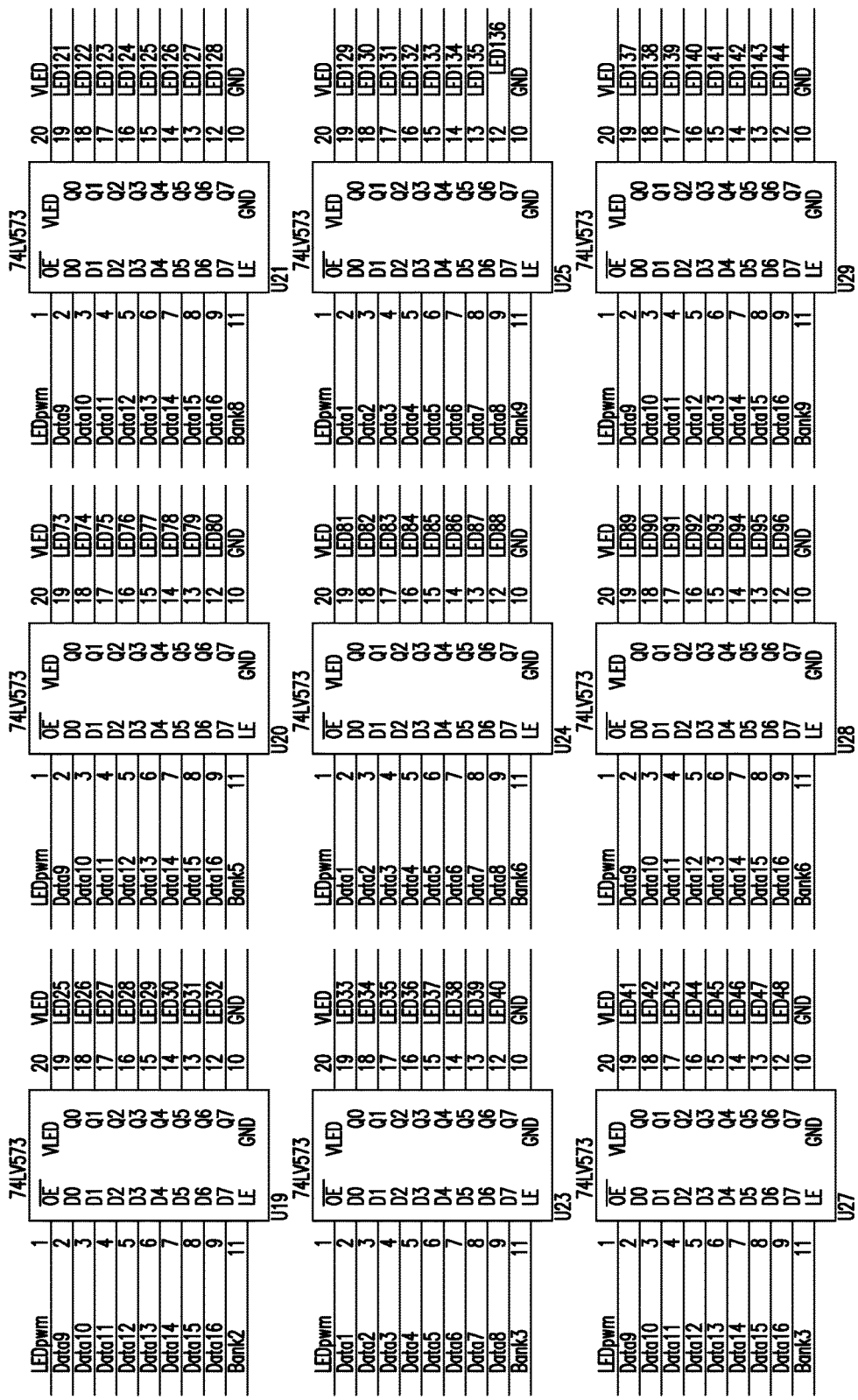
Figure 12:
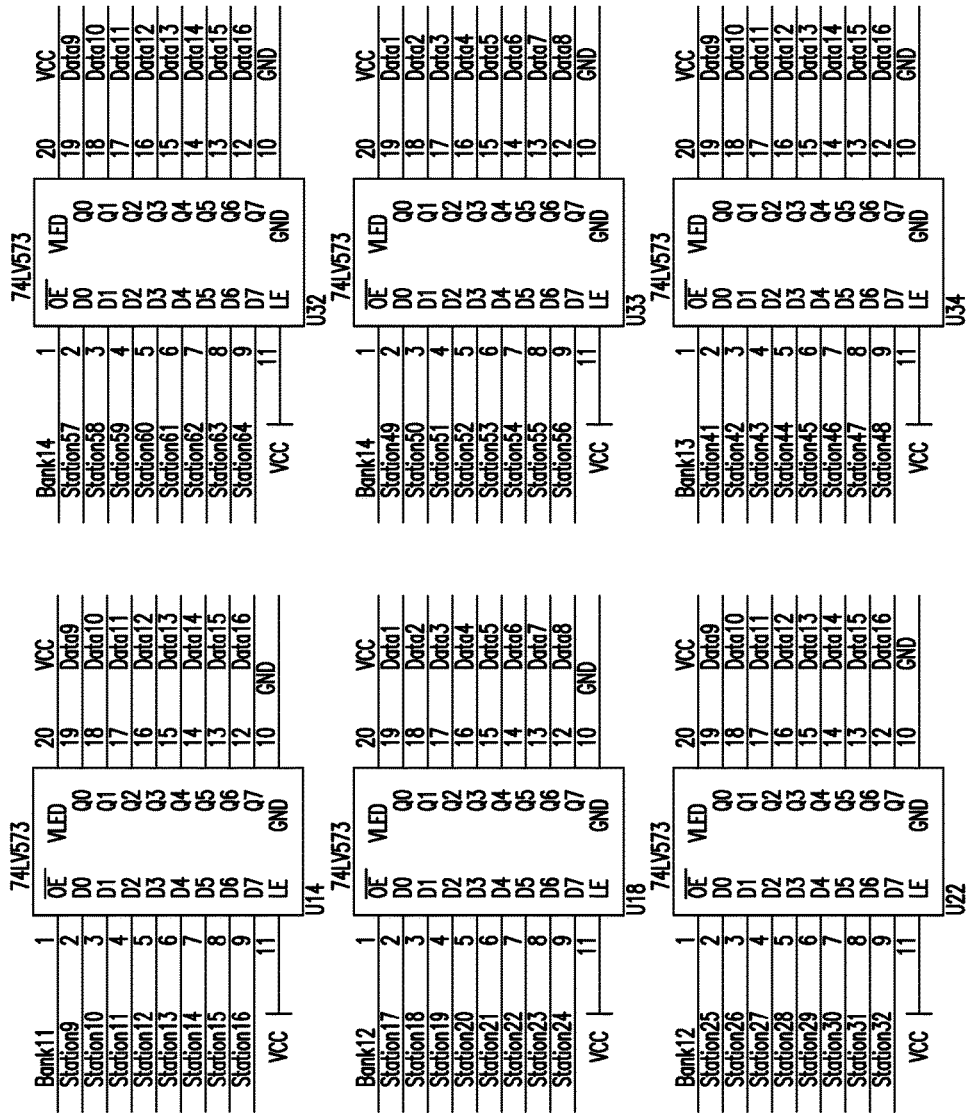

The electronic components are typically packaged in a taped and reeled style shape, commonly known as an SMT (surface mount technology) reel (20). These packages could typically contain between 5,000 and 10,000 electronic pieces per reel (package). A cart (10), as shown in the accompanying drawings, is designed to house 14 rows (26A-26G) of 7 inch reels in single package single locations using two conductive plastic dividers (30) per reel (20) and two metal rods per row. The plastic dividers (30) form slots defining reel storage locations for placement of the reels (20) therein. The arrangement of these plastic dividers (30) minimizes the excess space between the reels in three dimensions. There are seven rows on each side of the cart (10), for a total of 14 rows. The plastic dividers (30) in each row have 80 reel storage locations for a total of 1,120 reel storage locations on the cart. The drawing of this assembly is shown in FIG. 1.

Each reel (20) is held with a light pipe (40) that is structured and configured to cradle the reel (20) within the slot between the dividers (30). Each light pipe (40) is supported within a respective slot in a row and is movable on a pivot axis (42) between a closed position and an open position. A PCB assembly (43) and a multi-colored LED (45) are mounted behind the light pipe. A magnet (47) is securely placed within the light pipe right where it rests above the LED. One light pipe (40) with a magnet (47) is snapped to each of the divider assemblies. There are eighty locations in each row with a light pipe assembly snapped to each location. Each light pipe (40) is designed to have two points of entry for light; one light entry point is shown as (B) and the other light entry point is shown as (A).

The light pipe (40) serves three purposes. The first purpose is to aid the operator to place the reels (20) in their respective plastic divider slot location and to hold the reel (20) within the slot. This is done by resting the reel (20) against the back end (44) of the light pipe and then allow the light pipe (40) to pivot on the rod (42) to place the reel (20) in its resting position in the plastic divider housing. When a reel is inserted and the light pipe pivots to its closed position the magnet activates the hall sensor, signaling the insertion of a reel and fulfilling the light pipe's second purpose. The third purpose of the light pipe (40) is to direct light from a dual color LED (45) for indicating multiple jobs status as well as the location of selected parts within the cart (10) and to also indicate the SMT reel status (e.g., reel removed).

There are 14 PCB assemblies that contain the electronic sensors and LED indicators. There are two PCBs per row and each PCB has 80 sensors. Two of the electronic PCB assemblies (43) will be able to control all the positions of the two parallel divider assemblies consisting of 160 positions. Each PCB (43) communicates to a controller via an RS-232 signal as is shown in the schematic using the U2 IC. The RS-232 signal is connected also to the PCB microprocessor, U1, which is connected to eighty LEDs, LS1-LS80, and eighty hall effect switches, SW1-SW80, for detecting the presence or absence of each magnet (47). The microprocessor is also attached to the PCB's EEPROM memory device, U3. When the operator wants to place a reel (20) in the plastic dividers (30), he or she enters (e.g., with the use of an optical scanner (62) carried on the cart) the part number and quantity of the parts contained on the reel (20) in the controller. The controller sends this information via the RS 232 communication bus to all the PCBs (43). Then the operator simply places the reel (20) he or she just scanned into any one of the available plastic divider slots. The PCB hall effect sensor detects the presence of a new magnet from the light pipe (40) that just pivoted back into its closed position. The PCB microprocessor assembly (43) reports back to the computer with the location of the reel (20) that was just placed within a slot. It also blinks the LED (45) in that reel's location indicating to the operator that it registered the recording of the information related to the reel location, part number, and quantity of parts on the reel (20). When the reel (20) is placed within the slot between the dividers (30), the LED light enters the light pipe (40) at point (B) of the light pipe (40) shown in FIG. 7B. The light directed through the light pipe (40) illuminates the opposite, outboard end (C) of the light pipe (40) to indicate the location of the selected part and also the status of the light pipe (40) position and the reel (20).

When the operator wants to retrieve a part, he or she can physically go to the cart computer or via an internet link to the cart computer, for example with use of an electronic tablet (60) carried on an end of the cart (10). The operator enters the part number or list of part numbers that he or she wants to find in the cart (10). The computer searches in its memory for all the parts that have been placed in the cart (10) and sends a command to the cart PCBs (43) and instructing them to illuminate the LED (45) of each location containing parts that the operator requires. This light enters the light pipe (40) at point (B) when the PCB turns on its LED (45). Then the operator removes the reel (20) by pulling down on the end (46) of the light pipe (40) which causes the light pipe (40) to rotate around pivot point created by the metal rod (42), to thereby allow easy removal of the reel. Then the PCB hall effect sensor will detect that the magnet is no longer present and then will stop illuminating that location, and the microprocessor will report the removal of the reel (20) to its controller via the RS-232 link.

If the operator removes the wrong part (i.e., the wrong reel), then the LED (45) at the location where the wrong part was removed will blink red indicating a problem. The light from the LED (45) at this point will enter at point (A) of the light pipe (40). The controller will instruct the operator of the mistake and will ask him or her to correct the error.

When supplied with bill-of-material information, including the required part numbers and the quantity of components required for each PCB assembly to be built, the intelligent inventory storage system's software can calculate the total quantity of each component required to complete a job. When a reel is issued on a job, the intelligent inventory storage system's software calculates the number of PCB assemblies able to be completed with the quantity of components available on that reel. When the operator requests another reel, the software can ask him or her how many PCB assemblies have been built. If this quantity of built PCB assemblies differs significantly from what the intelligent inventory storage system's software calculated based on the previously issued reel's quantity, it means there was a discrepancy in the quantity on the previously issued reel. Based on the actual number of boards built before the previous reel was emptied, the intelligent inventory storage system's software calculates the actual quantity of components contained on the previously issued reel, and correctly calculates the amount of components to be consumed on the new reel. This feature allows the intelligent inventory storage system to detect and correct inventory inaccuracies. The intelligent inventory storage system is able to calculate the quantity of components on an SMT reel based on the diameter of the tape remaining on the reel, the thickness of the tape on the reel, the pitch of the components on the reel tape, as well as the maximum number of components able to be stored on an SMT reel. These quantities can be manually entered or input via sensors.

What is claimed is:

1. An intelligent inventory storage system for storing and retrieving parts and components packaged on SMT reels for the assembly of PCB's, said system comprising:
    a cart;
    at least one divider assembly mounted within the cart and providing a plurality of storage slots, each of said storage slots being sized, structured and configured for receipt of at least one SMT reel therein;
    a plurality of light pipes each being supported within a respective one of the plurality of slots, and each of the light pipes including a cradle structure that is structured and disposed for holding at least one of the SMT reels within the cradle structure, and each of said plurality of light pipes being movable between a stowed position and a release position to allow loading of an SMT reel into the cradle and removal of an SMT reel from the storage slot when in the release position; and
    each of said plurality of light pipes including a first light entry point for allowing entry of light from a dual color LED indicator when the light pipe is in the stowed position, and a second light entry point for allowing entry of light from the dual color LED indicator when the light pipe is moved to the release position, and each of said plurality of light pipes further including an opposite outboard end that is structured to illuminate when light is directed through either the first light entry point or the second light entry point, thereby visually indicating the location and status of the SMT reel.

2. The intelligent inventory storage system as recited in claim 1 wherein the cart is structured and disposed to link and communicate with at least one computer to allow for selection of parts or components to be retrieved from one or more of the SMT reels stored in the cart and for tracking inventory of parts and components stored in the cart.

3. The intelligent inventory storage system as recited in claim 2 wherein the intelligent inventory storage system is further structured and disposed to detect and correct inventory inaccuracies.

4. The intelligent inventory storage system as recited in claim 2 wherein the intelligent inventory storage system is structured to detect and correct inventory inaccuracies based on the difference between the expected quantity of PCB assemblies built per SMT reel issued by the intelligent inventory storage system and the actual quantity of PCB assemblies built per SMT reel issued by the intelligent inventory storage system.

5. The intelligent inventory storage system as recited in claim 4 wherein the intelligent inventory storage system is structured and disposed to calculate the quantity of components on an SMT reel based on the diameter of tape remaining on an SMT reel.

6. The intelligent inventory storage system as recited in claim 4 wherein the intelligent inventory storage system is structured and disposed to calculate the quantity of components on an SMT reel based on the thickness of tape remaining on an SMT reel.

7. The intelligent inventory storage system as recited in claim 4 wherein the intelligent inventory storage system is structured and disposed to calculate the quantity of components on an SMT reel based on the pitch of the components on the SMT reel.

8. The intelligent inventory storage system as recited in claim 4 wherein the intelligent inventory storage system is structured and disposed to calculate the quantity of components on an SMT reel based on the maximum number of components able to be stored on the SMT reel.

9. The intelligent inventory storage system as recited in claim 1 further comprising:
    at least one movable door that is operable between an open position to allow removal of the SMT reels from the respective storage slots, and a closed position to prevent removal of the SMT reels from within the storage slots while still allowing the parts and components to be dispensed from the SMT reels.

* * * * *